United States Patent [19]
Ghorbani et al.

[11] Patent Number: 5,886,296
[45] Date of Patent: *Mar. 23, 1999

[54] OUTSIDE TELECOMMUNICATIONS EQUIPMENT ENCLOSURE HAVING HYDROPHOBIC VENT

[75] Inventors: Ali Ghorbani; Walter Mark Hendrix, both of Richardson; Marc DeFrancesco, Plano, all of Tex.

[73] Assignee: Fujitsu Network Communications, Richardson, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 934,813
[22] Filed: Sep. 22, 1997

Related U.S. Application Data

[63] Continuation of Ser. No. 481,064, Jun. 7, 1995, abandoned.
[51] Int. Cl.⁶ ................................................. H02B 1/00
[52] U.S. Cl. ............................................................. 174/50
[58] Field of Search .................................. 174/50, 38, 37; 95/900; 55/528; 96/13, 14

[56] References Cited

U.S. PATENT DOCUMENTS

| | | | |
|---|---|---|---|
| 3,197,946 | 8/1965 | Taylor | 95/273 |
| 4,190,426 | 2/1980 | Ruschke | 96/6 |
| 4,340,402 | 7/1982 | Catron | 55/487 |
| 4,665,707 | 5/1987 | Hamilton | 62/3.3 |
| 4,666,479 | 5/1987 | Shoji | 55/385.4 |
| 4,751,872 | 6/1988 | Lawson, Jr. | 454/184 |
| 4,877,433 | 10/1989 | Oshitari | 55/486 |
| 4,889,542 | 12/1989 | Hayes | 95/285 |
| 4,902,306 | 2/1990 | Burnett et al. | 95/69 |
| 4,902,423 | 2/1990 | Bacino | 210/500.36 |
| 4,904,288 | 2/1990 | d'Augereau | 55/485 |
| 4,949,218 | 8/1990 | Blanchard et al. | 361/696 |

*Primary Examiner*—Thomas M. Dougherty
*Assistant Examiner*—Joseph Waks
*Attorney, Agent, or Firm*—Staas & Halsey

[57] ABSTRACT

An outside plant equipment enclosure for housing telecommunications equipment, which normally operates when the equipment enclosure is closed, is provided. The enclosure includes an internal compartment for storing telecommunications equipment, at least one opening in the internal compartment and a hydrophobic material. The at least one opening defines substantially the entire area of the internal compartment which is open to an outer atmosphere when the telecommunications equipment is normally operating. The hydrophobic material entirely covers every opening of the at least one opening.

14 Claims, 3 Drawing Sheets

OUTSIDE TELECOMMUNICATIONS EQUIPMENT ENCLOSURE HAVING HYDROPHOBIC VENT

This application is a continuation of application Ser. No. 08/481,064, filed Jun. 7, 1995, now abandoned.

BACKGROUND OF THE INVENTION

1. Field of the Invention.

This invention relates in general to outside equipment enclosures, and more particularly to venting watertight equipment enclosures which house telecommunications equipment.

2. Description of the Related Art

Highly sensitive telecommunications equipment, such as remote phone switching equipment, is often housed in an outside enclosure. Because of the sensitivity of the equipment, it is crucial that the enclosure be watertight, even in inclimate weather. Thus, enclosures of this kind are often sealed.

FIG. 1 is a schematic view of an enclosure for housing electronic telecommunications equipment. The enclosure has sidewalls 2, 4, top 6 and base 8. An interior chamber 10 for housing telecommunications equipment is provided above base 8. To cool the electronics equipment, heat exchangers 12 are provided. The interior chamber 10 is sealed by diagonal plates 14, 16 and a longitudinal plate 18. Air is not permitted to flow around plates 14, 16, 18.

The telecommunications equipment to be stored in the enclosure may have volatile memories which could be erased upon power loss. Therefore, backup batteries 20 and battery charger 22 are provided within the enclosure to protect the telecommunications equipment in the event of a power loss. However, the batteries 20 emit hydrogen and other gases when the batteries 20 are being charged and used. Therefore, there is a need to vent gases from the enclosure. However, as stated above, it is crucial that the enclosure be watertight.

Currently, fiber optics are used to transmit data long distances between large commercial users. However, it is generally not possible for an individual or small company to use fiber optics for receiving information. Work is progressing so that an individual user can receive multimedia data (video) through asynchronous transfer mode (ATM) on optical fibers. To this end, an optical fiber would be fed to a "pedestal" from which signals would be distributed to individual users by conventional means, such as twisted coaxial wires.

The electronics equipment housed in the pedestals used for distributing signals is highly sensitive. Moisture seriously interferes with the operation of such equipment. However, in flooding conditions, a pedestal may be under several feet of water. Moreover, it is necessary to dissipate heat generated by the electronics equipment.

SUMMARY OF THE INVENTION

Accordingly, it is an object of the present invention provide a hydrophobic vent from which it is possible to vent gases from a telecommunications equipment enclosure without compromising the watertight nature of the enclosure.

It is a further object of the present invention to provide a device which can dissipate heat from equipment enclosures such as a pedestal, while ensuring that the equipment within the pedestal will not be disturbed even under flood conditions.

According to the present invention, an outside plant equipment enclosure for housing telecommunications equipment which normally operates when the equipment enclosure is closed and sealed is provided. The enclosure includes an internal compartment for storing telecommunications equipment, one or more openings in the internal compartment and a hydrophobic material. The openings in the internal compartment define substantially the entire area of the internal compartment which is open to an outer atmosphere when the telecommunications equipment is normally operating. The hydrophobic material entirely covers every opening.

BRIEF DESCRIPTION OF THE DRAWINGS

The above and other objects and features of the invention will be apparent from the description of the embodiments taken along with reference to the accompanying drawings in which.

DETAILED DESCRIPTION OF THE PREFERRED EMBODIMENTS

Figure 1:
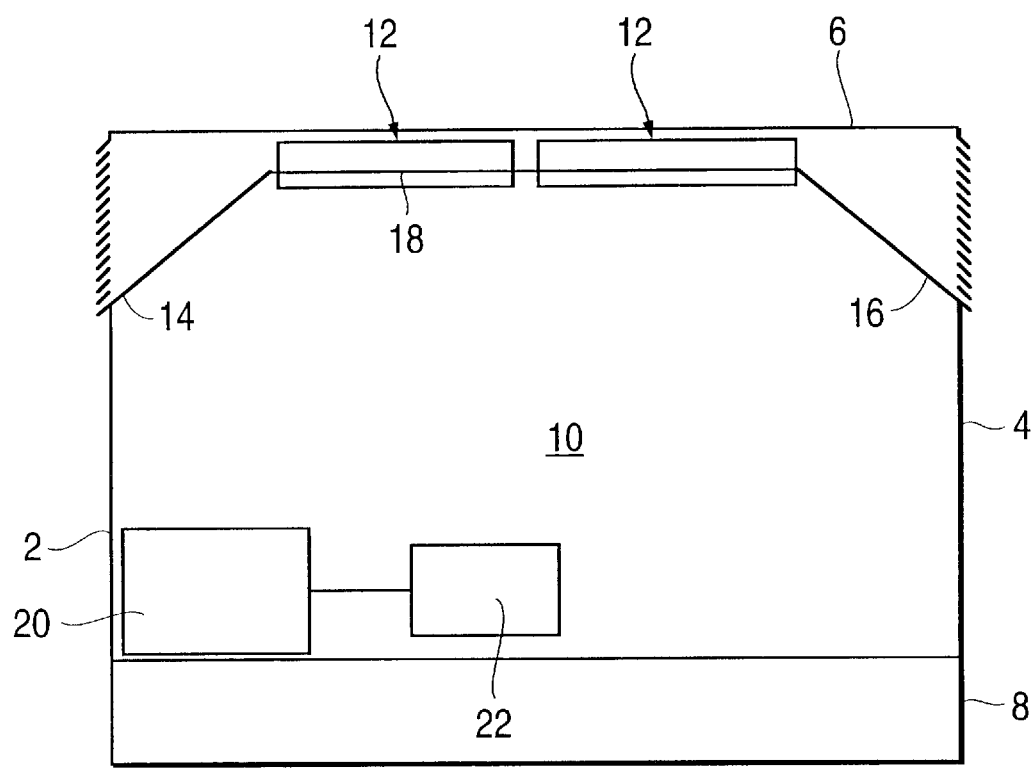
FIG. 1 is a schematic view of a enclosure for housing electronic equipment.
Figure 2:
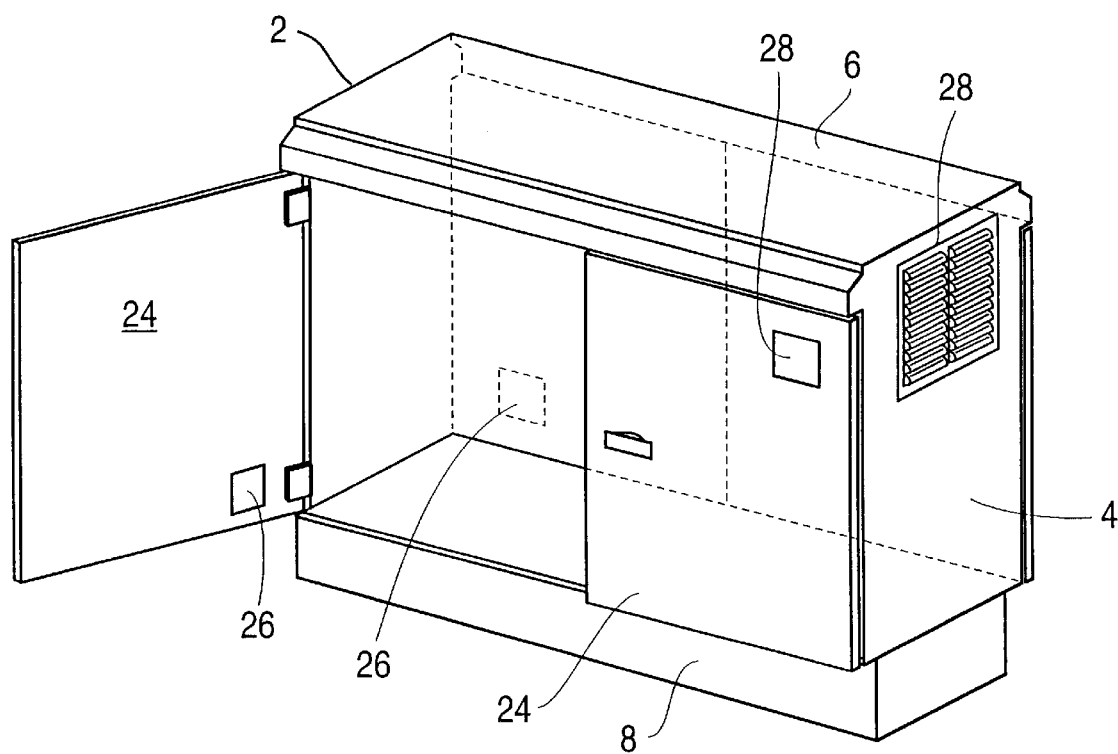
FIG. 2 is a perspective view of the enclosure shown in FIG. 1 showing openings for hydrophobic vents according to the present invention.

FIG. 2 is a perspective view of the outside telecommunications equipment enclosure shown in FIG. 1. The equipment enclosure has two doors 24 on both a front side and a back side which are all normally closed when the equipment is operating to seal the interior chamber 10 of the equipment enclosure. The equipment enclosure has openings 26, 28 which define substantially the entire area of the internal compartment open to an outer atmosphere when the telecommunications equipment is normally operating. Openings 26, 28 are positioned in corresponding places in the front and back doors 24. Openings 26 are shown in the lower left hand corner in FIG. 2. Openings 26 function as air inlets. Openings 28 are shown in the upper right hand corner in FIG. 2. Openings 28 function as air exits.

Hydrophobic material of a hydrophobic vent covers substantially the entire surface area of every opening 26, 28 of the enclosure. It is very important that uncovered openings be minimized and that the enclosure be well sealed. Otherwise, water tightness will be compromised.

Figure 3:
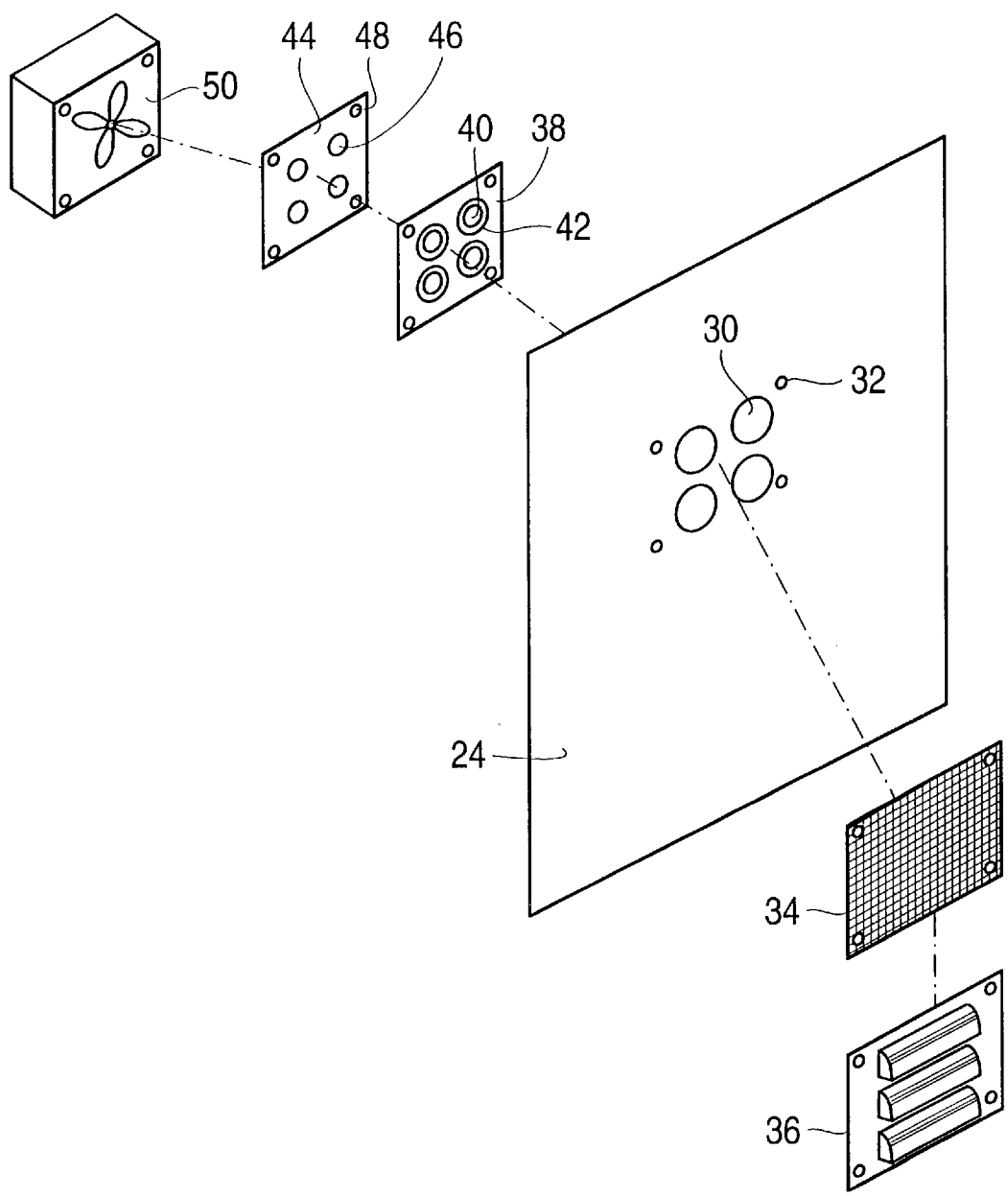
FIG. 3 is an exploded view of a hydrophobic vent adapted for the openings shown in FIG. 2.

FIG. 3 is an exploded view of a hydrophobic vent adapted for the openings 26, 28 shown in FIG. 2. In FIG. 3, reference numeral 24 denotes a portion of the panel which serves as the door of the enclosure. More particularly, the portion of door 24 shown in FIG. 3 is that portion which includes an opening 26, 28 and the portion of door 24 surrounding the opening 26, 28. The shell of the enclosure, including the doors 24 may be made of one-eighth inch sheet aluminum. In FIG. 3, the door 24 is shown as having holes 30, 32. It should be noted that the openings 26, 28 are shown schematically in FIG. 2. Each of the openings 26, 28 shown in FIG. 2 actually comprises the holes 30, 32 shown in FIG. 3. Holes 30 allow air passage therethrough, and holes 32 are adapted for mounting screws (not shown). 4-40 type screws may be used as the mounting screws. Holes 30, 32 may be made in door 24 by conventional means, such as punching.

Reference numeral 34 of FIG. 3 denotes a screen which is formed on an exterior side of door 24. Screen 34 stops large dust particles from reaching the hydrophobic material (denoted by reference numeral 40) positioned interior to screen 34 and also prevents sharp objects, which may puncture the hydrophobic material 40 from entering the hydrophobic vent. Screen 34 is a wire mesh screen which may have 0.050 inch by 0.050 inch openings. Screen 34 may be plastic, aluminum or stainless steel.

Reference numeral 36 of FIG. 3 denotes louvers which are formed exterior to the screen 34. Screen 34 may be slightly smaller than louvers 36 so that screen 34 is not visible from outside the enclosure. Louvers 36 provide additional protection for the hydrophobic material 40 and also serve cosmetic purposes. Louvers 36 may be plastic. As can be seen, both screen 34 and louvers 36 have holes for mounting screws. While the screen 34 and louvers 36 are described as separate elements, screen 34 and louvers 36 may be integrated as a single part.

Directly behind the door 24 is a filter sheet 38 including the hydrophobic material 40 and a circular adhesive strip 42. The circular adhesive strip 42 secures hydrophobic material 40 (and filter sheet 38) to door 24. The outer diameter of the adhesive strips 42 is 2.0 inches and the diameter of hydrophobic material 40 (inner diameter of adhesive strips) is 1.50 inches.

The hydrophobic material 40 may be made of a variety of materials, as long as the material 40 does not absorb water. As such natural fabrics such as cotton are not suitable, and synthetic polymer materials are preferable. The hydrophobic material 40 has openings which are large enough to allow gases to pass therethrough, but small enough to prohibit liquids from passing therethrough. There is a somewhat large range of opening sizes which meet this requirement. However, the size of the openings also determines to what extent water can be pressurized on the hydrophobic material 40 before water will penetrate. The smaller the opening, the greater the amount of water pressure the hydrophobic material 40 will withstand. Variations in the size of the openings also determine to what extent air must be pressurized to penetrate the hydrophobic material 40. The smaller the opening the more air pressure required. Presently, it is necessary for the hydrophobic material 40 to withstand a pressure of ten feet of water (in the case of a video pedestal) and 0.25 pounds per square inch (in the case of the enclosure shown in FIGS. 1 and 2). Under these design parameters, the size of the openings may be between 3 and 25 microns, and preferably between 10 and 15 microns. For higher water pressure applications, openings between 3 and 10 microns are preferable. For lower water pressure applications, openings between 15 and 25 microns are preferable.

Because the enclosure is described as having openings 26 for air inlet and separate openings 28 for air outlet, the hydrophobic material 19 may be a one-way material which allows air to only move in one direction through the hydrophobic material 40. Of course, the hydrophobic material 40 may also be a two-way material which allows air to move in both directions through the hydrophobic material 40. Expanded polytetrafluoroethylene (ePTFE), sold under the trademark GORE-TEX® by W.L. Gore & Associates, is an example of a two-way hydrophobic material 40.

Interior to the filter sheet 38 is a supporting plate 44. Supporting plate 44 serves as additional support for the hydrophobic material 40 to prevent hydrophobic material 40 from stretching outside its intended shape. Supporting plate 44 may be a 4.375 inch by 4.375 inch square plate. Four internal holes 46 are provided in supporting plate 40. The internal holes 46 are sized and positioned to correspond with the shape of the hydrophobic material 40. Four exterior holes 48 are provided to serve as press nuts for the mounting screws. Supporting plate 44 may be made of stainless steel.

To improve air flow out of the enclosure, a fan may be provided for the hydrophobic vents at openings 28. Interior to supporting plate 44, a fan 50 is shown. Fan 50 is for developing an increased air pressure on the hydrophobic material 40. In this manner, fan 50 enable the use of hydrophobic material which has smaller openings. Thus, fan 50 also makes it possible for hydrophobic material 40 to have increased water resistance. To minimize maintenance of the enclosure, it is important that fan 50 be a high precision fan which is very reliable. Moreover, the space for mounting fan 50 behind the doors 24 is very limited. Therefore, fan 50 must be relatively very small.

It is important to note that the fan configuration can be easily altered. For example, fans 50 may be provided at both the inlet openings 26 and the outlet openings 28. Alternatively, it may be possible to use no fan at all. In fact, in the case of a video pedestal enclosure, fans will probably not be necessary.

The many feature and advantages of the present invention are apparent from the detailed specification, and thus, it is intended for the appended claims to cover all such features and advantages of outside telecommunications equipment enclosures having hydrophobic vents, which fall within the true spirit and scope of the invention. Further since numerous modifications and changes will readily occur to those skilled in the art based on the disclosure herein, it is not desired to limit the invention to the exact construction and operation illustrated and described. Accordingly, all suitable modifications and equivalents may be resorted to falling within the true spirit and scope of the invention.

For example, openings 26, 28 have been described as being provided in doors 24. By providing openings 26, 28 in doors 24, there is easy access for installation of a hydrophobic vent. This is particularly helpful when it is desired to retrofit a hydrophobic vent to an existing enclosure. However, the openings (and corresponding hydrophobic vents) may be provided in areas of the enclosure other than the doors.

Also, two inlet openings 26 and two outlet openings 28 have been described. However, the number of openings 26, 28 can easily be altered. For example, because fans 50 are not provided at the inlet openings 26, it may be desirable to have more inlet openings 26 than outlet openings 28. In this manner, the air flow will be equalized.

What is claimed is:

1. An outside plant equipment enclosure for housing telecommunications equipment, comprising:

a cabinet wall defining an internal compartment for housing telecommunications equipment which normally operates when the equipment enclosure is closed and sealed;

at least one pair of openings in the internal compartment, the at least one pair of openings including inlet and outlet openings and defining substantially an entire area of the internal compartment which is open to an outer atmosphere when the telecommunications equipment is normally operating;

a hydrophobic material entirely covering the at least one pair of openings;

an inlet fan attached to the cabinet wall at the inlet opening to force air through the hydrophobic material and into the internal compartment, the hydrophobic material being positioned between the inlet opening and the inlet fan; and an outlet fan attached to the cabinet wall at the outlet opening to force air through the hydrophobic material and out of the internal compartment, the hydrophobic material being positioned between the outlet opening and the outlet fan.

2. An outside plant equipment enclosure according to claim 1, wherein the hydrophobic material has openings which are between 3 and 25 microns wide.

3. An outside plant equipment enclosure according to claim 1, wherein the hydrophobic material has openings which are between 10 and 25 microns wide.

4. An outside plant equipment enclosure according to claim 1, wherein the hydrophobic material has openings which are between 3 and 10 microns wide.

5. An outside plant equipment enclosure according to claim 1, wherein the hydrophobic material has openings which are between 15 and 25 microns wide.

6. An outside plant equipment enclosure according to claim 1, wherein the hydrophobic material is an expanded polytetrafluoroethylene.

7. An outside plant equipment enclosure according to claim 1, wherein there are a plurality of air inlet openings and one or more air outlet openings, the number of the air inlet openings being greater than the number of the air outlet openings.

8. An outside plant equipment enclosure according to claim 1, further comprising a backup battery located within the internal compartment.

9. An outside plant equipment enclosure according to claim 1, wherein each of said at least one pair of openings includes a plurality of holes formed through the cabinet wall, the hydrophobic material being provided in pieces respectively covering the holes in the cabinet wall.

10. An outside plant equipment enclosure according to claim 9, wherein each of said pieces of said hydrophobic material is surrounded by an adhesive, the adhesive being adhered to the cabinet wall.

11. An outside plant equipment enclosure according to claim 1, further comprising wire mesh screens respectively provided adjacent to the at least one pair of openings, exterior to the internal compartment, and on an opposite side of the cabinet wall from the hydrophobic material and the inlet and outlet fans.

12. An outside plant equipment enclosure according to claim 1, further comprising support plates respectively provided between the hydrophobic material and the inlet and outlet fans.

13. An outside plant equipment enclosure according to claim 1, wherein the inlet openings are provided toward a bottom of the cabinet and the outlet openings are provided toward a top of the internal compartment.

14. An outside equipment enclosure according to claim 1, wherein there are at least two pairs of inlet and outlet openings respectively provided on opposing sides of the internal compartment.

* * * * *